United States Patent
Park et al.

(10) Patent No.: US 8,487,383 B2
(45) Date of Patent: Jul. 16, 2013

(54) FLASH MEMORY DEVICE HAVING TRIPLE WELL STRUCTURE

(75) Inventors: Yoon-Moon Park, Seoul (KR); Se-Jun Park, Suwon-si (KR); Suk-Kang Sung, Seongnami-si (KR); Keon-Soo Kim, Hwaseong-si (KR); Jung-Dal Choi, Hwaseong-si (KR); Choong-Ho Lee, Yongin-si (KR); Jin-Hyun Shin, Suwon-si (KR); Seung-Wook Choi, Suwon-si (KR); Dong-Hoon Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 343 days.

(21) Appl. No.: 12/964,003

(22) Filed: Dec. 9, 2010

(65) Prior Publication Data

US 2011/0140202 A1    Jun. 16, 2011

(30) Foreign Application Priority Data

Dec. 15, 2009    (KR) ................. 10-2009-0124835

(51) Int. Cl.
*H01L 21/331* (2006.01)

(52) U.S. Cl.
USPC ............ 257/371; 257/339; 257/E27.067

(58) Field of Classification Search
USPC ............... 257/371, 341, 339, E27.067
See application file for complete search history.

(56) References Cited

U.S. PATENT DOCUMENTS

| | | | |
|---|---|---|---|
| 2005/0006701 A1 | 1/2005 | Sung et al. | |
| 2005/0077951 A1* | 4/2005 | Kim | 327/536 |
| 2009/0020826 A1* | 1/2009 | Huang et al. | 257/371 |

FOREIGN PATENT DOCUMENTS

| | | |
|---|---|---|
| JP | 06-085200 A | 3/1994 |
| JP | 11-191616 A | 7/1999 |
| JP | 11-261022 A | 9/1999 |
| JP | 2007-220736 A | 8/2007 |
| KR | 10 1996-0008309 B1 | 6/1996 |
| KR | 10-1998-0034565 A | 8/1998 |
| KR | 10 2000-0032294 A | 6/2000 |
| KR | 10-0273705 B1 | 9/2000 |
| KR | 10 2003-0050357 A | 6/2003 |
| KR | 10-0808376 B1 | 2/2008 |

* cited by examiner

*Primary Examiner* — Chuong A Luu
*Assistant Examiner* — Nga Doan
(74) *Attorney, Agent, or Firm* — Lee & Morse, P.C.

(57) ABSTRACT

A flash memory device, including a cell array region where a plurality of memory cells are connected in series to a single cell string, the cell array region including a pocket p-well configured to accommodate the plurality of memory cells and an n-well configured to surround the pocket p-well, a first peripheral region where low-voltage (LV) and high-voltage (HV) switches are connected to the memory cells through a word line, and a second peripheral region where bulk voltage switches are connected to bulk regions of the LV and HV switches.

20 Claims, 6 Drawing Sheets

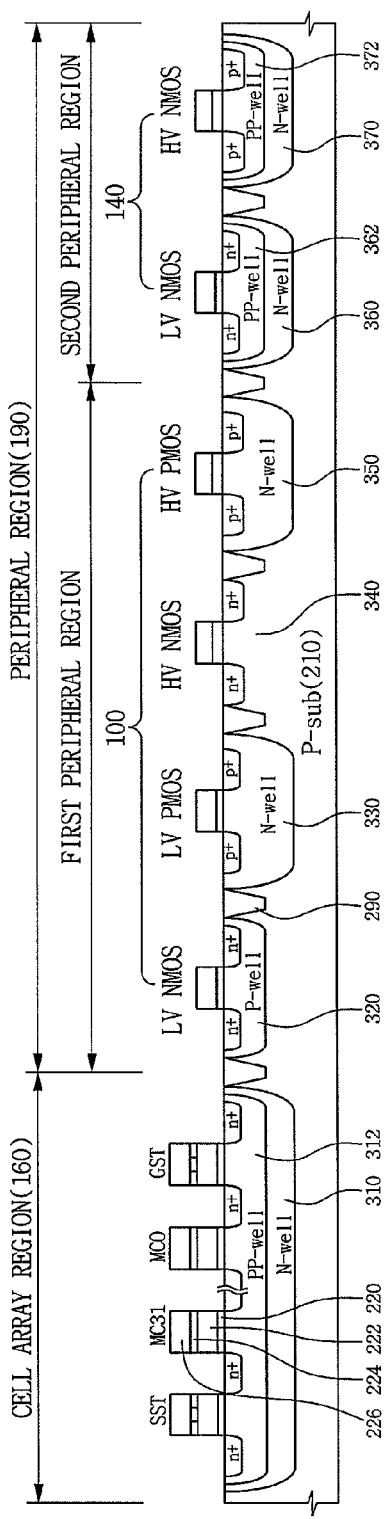
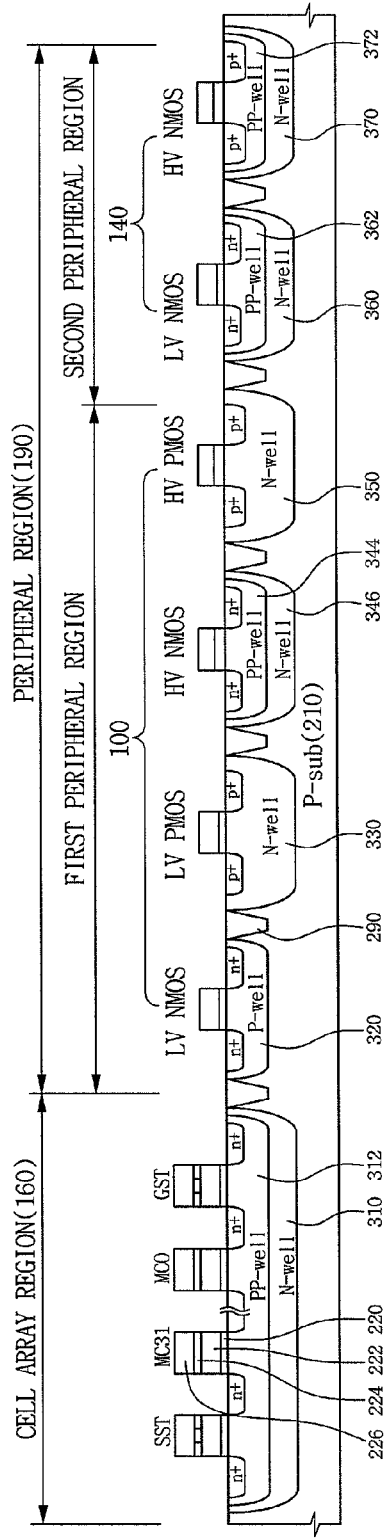
FIG. 3
FIG. 4

FLASH MEMORY DEVICE HAVING TRIPLE WELL STRUCTURE

BACKGROUND

1. Field

Embodiments relate to a flash memory device having a triple well structure.

2. Description of the Related Art

A semiconductor fabrication process may include determining the range of a well in a semiconductor substrate and implanting impurities using an ion implantation process to form a well.

SUMMARY

An embodiment is directed to a flash memory device, including a cell array region where a plurality of memory cells are connected in series to a single cell string, the cell array region including a pocket p-well configured to accommodate the plurality of memory cells and an n-well configured to surround the pocket p-well, a first peripheral region where low-voltage (LV) and high-voltage (HV) switches are connected to the memory cells through a word line, the first peripheral region including an LV NMOS region where an NMOS transistor for the LV switch is disposed, an LV PMOS region where a PMOS transistor for the LV switch is disposed, an HV NMOS region where an NMOS transistor for the HV switch is disposed, and an HV PMOS region where a PMOS transistor for the HV switch is disposed, and a second peripheral region where bulk voltage switches are connected to bulk regions of the LV and HV switches, the second peripheral region including an HV PMOS region where an NMOS transistor for an HV bulk voltage switch is disposed, the HV PMOS region including a pocket p-well configured to accommodate the NMOS transistor for the HV bulk voltage switch and an n-well configured to surround the pocket p-well.

In the first peripheral region, a p-well of the same conductivity type as a substrate may be provided in the LV NMOS region where the NMOS transistor for the LV switch is disposed, and an n-well of a different conductivity type from the substrate may be provided in both the LV PMOS region where the PMOS transistor for the LV switch is disposed and the HV PMOS region where the PMOS transistor for the HV switch is disposed.

In the first peripheral region, the HV NMOS region where the NMOS transistor for the HV switch is disposed may maintain the same bulk concentration as the substrate.

In the first peripheral region, a pocket p-well configured to accommodate the NMOS transistor for the HV switch and an n-well configured to surround the pocket p-well may be provided in the HV NMOS region where the NMOS transistor for the HV switch is disposed.

The second peripheral region may further include an LV PMOS region where an NMOS transistor for an LV bulk voltage switch is disposed, a pocket p-well configured to accommodate the NMOS transistor for the LV bulk voltage switch and an n-well configured to surround the pocket p-well may be provided in the LV PMOS region where the NMOS transistor for the LV bulk voltage switch is disposed, and, in the second peripheral region, the n-well and the pocket p-well of the HV PMOS region may be doped with impurities to greater depths and at lower doping concentrations than the n-well and the pocket p-well of the LV PMOS region.

The second peripheral region may further include an LV PMOS region where an NMOS transistor for an LV bulk voltage switch is disposed, and, in the second peripheral region, the LV PMOS region where the NMOS transistor for the LV bulk voltage switch may be disposed and the HV PMOS region have a common bulk region.

Another embodiment is directed to a flash memory device, including cell transistors disposed in a cell array region and configured to have a cell array structure, a low-voltage (LV) switch and a high-voltage (HV) switch disposed in a peripheral region to transmit a negative voltage to word lines of the cell transistors, and a bulk voltage switch disposed in the peripheral region and configured to transmit the negative voltage as bulk voltages of the LV and HV switches. Each of the cell transistors may have a first triple well structure to be electrically isolated from the peripheral region, and the bulk voltage switch may have a second triple well structure to be electrically isolated from the LV and HV switches.

The first triple well structure may include a first n-well of a different conductivity type from a p-substrate, and a first pocket p-well of the same conductivity type as the p-substrate surrounded by the first n-well to function as bulk regions of the cell transistors, the second triple well structure may include a second n-well of a different conductivity type from the p-substrate, and a second pocket p-well of the same conductivity type as the p-substrate surrounded by the second n-well to function as bulk regions of the cell transistors, and the first and second n-wells or the first and second pocket p-wells may have the same projected range and doping concentration.

Each of the LV and HV switches may include a transistor configured to apply a negative voltage and a well functioning as a bulk region of the transistor of each of the LV and HV switches, the transistor of each of the LV and HV switches may be selected from an NMOS transistor for the LV switch, a PMOS transistor for the LV switch, an NMOS transistor for the HV switch, and a PMOS transistor for the HV switch, and the well of each of the LV and HV switches may be selected from a p-well doped with impurities of the same conductivity type as the p-substrate, an n-well doped with impurities of a different conductivity type from the p-substrate, and a p-well having the same bulk concentration as the p-substrate.

The bulk voltage switch may include an HV NMOS transistor accommodated in the second pocket p-well.

The second pocket p-well may have a projected range of about 1.0 μm or more, the projected range of the second pocket p-well being greater than the projected range of the first pocket p-well.

The second n-well may have a projected range of about 1.5 μm or more, the projected range of the second n-well being greater than the projected range of the first n-well.

The second pocket p-well may have a doping concentration ranging from about $1E^{11}$ atoms/cm$^2$ to about $1E^{13}$ atoms/cm$^2$, the doping concentration of the second pocket p-well being lower than the doping concentration of the first pocket p-well.

The second n-well may have a doping concentration ranging from about $1E^{11}$ atoms/cm$^2$ to about $2E^{13}$ atoms/cm$^2$, the doping concentration of the second n-well being lower than the doping concentration of the first n-well.

Another embodiment is directed to a well structure of a flash memory device having a cell array region, where cell transistors are disposed, and a peripheral region configured to operate the cell array region, the well structure of the flash memory device including a well structure of the cell array region, and a well structure of the peripheral region. The well structure of the cell array region may include a substrate of a first conductivity type, a first well of a second conductivity type different from the substrate, and a first pocket well of the first conductivity type surrounded by the first well to function as bulk regions of the cell transistors, and the well structure of the peripheral region may include a second well of the first conductivity type configured to accommodate NMOS transistors for LV switches, a third well of the second conductivity type configured to accommodate PMOS transistors for the LV switches, a fourth well configured to accommodate NMOS transistors for HV switches to use the substrate as a bulk region, a fifth well of the second conductivity type configured to accommodate PMOS transistors for the HV switches, a sixth well of the second conductivity type configured to accommodate the NMOS transistors for the LV switches, a second pocket well of the first conductivity type surrounded by the sixth well to function as bulk regions of transistors for bulk voltage switches, a seventh well of the second conductivity type configured to accommodate the NMOS transistors for the HV switches, and a third pocket well of the first conductivity type surrounded by the seventh well to function as bulk regions of the transistors for the bulk voltage switches.

The projected range of the third pocket well may be about 1.5 times the projected range of the first pocket well or the second pocket well.

The third pocket well may have a projected range of more than 1.0 µm.

The third pocket well may have a lower doping concentration than the first pocket well or the second pocket well.

The doping concentration of the third pocket well may range from about $1E^{11}$ atoms/cm$^2$ to about $1E^{13}$ atoms/cm$^2$.

The seventh well may have a projected range of 1.5 µm or more, the projected range of the seventh well being greater than the projected range of the first well or the sixth well.

The doping concentration of the seventh well may ranges from about $1E^{11}$ atoms/cm$^2$ to about $2E^{13}$ atoms/cm$^2$.

BRIEF DESCRIPTION OF THE DRAWINGS

The above and other features and advantages will become more apparent to those of skill in the art by describing in detail example embodiments with reference to the attached drawings, in which:

FIG. 3 illustrates a longitudinal sectional view of well structures of a cell array region and a peripheral region of a NAND flash memory device according to example embodiments.

FIG. 4 illustrates a longitudinal sectional view of a well structure of a NAND flash memory device according to other example embodiments.

DETAILED DESCRIPTION

Figure 1:
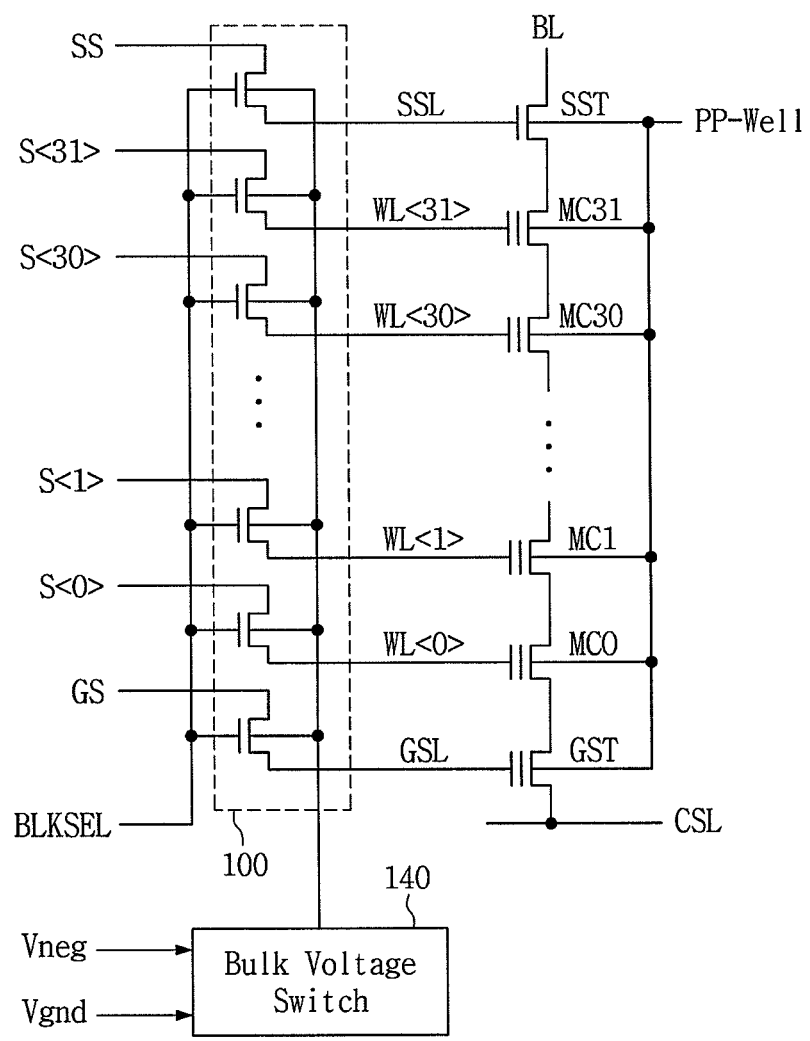
FIG. 1 illustrates a circuit diagram of a high-voltage (HV) switch and a cell string structure of a NAND flash memory device according to example embodiments.

Korean Patent Application No. 10-2009-0124835, filed on Dec. 15, 2009, in the Korean Intellectual Property Office, and entitled: "Flash Memory Device Having Triple Well Structure," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
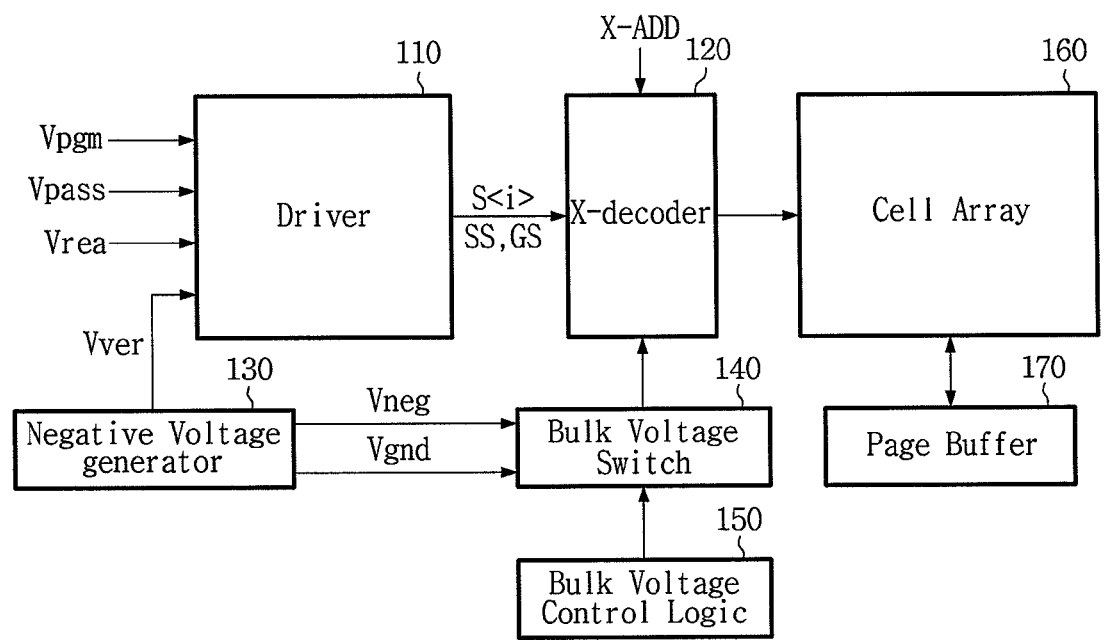
FIG. 2 illustrates a block diagram of a NAND flash memory device according to example embodiments.

FIG. 1 illustrates a circuit diagram of a high-voltage (HV) switch and a cell string structure of a NAND flash memory device according to example embodiments, and FIG. 2 illustrates a block diagram of a NAND flash memory device according to example embodiments.

Referring to FIG. 1, a ground selection transistor GST, a plurality of memory cells MC0 to MC31, and a string selection transistor SST may be connected in series to a single cell string. The ground selection transistor GST may be connected to a common source line CSL, and the string selection transistor SST may be connected to a bit line BL. The plurality of memory cells MC0 to MC31 may be connected to HV NMOS switches 100, which may resist a high voltage, through gates thereof. A string selection line SSL may be connected to a gate of the string selection transistor SST, and a ground selection line GSL may be connected to a gate of the ground selection transistor GST.

Sources of the HV switches 100 may be respectively connected to word lines WL<0> to WL<31>, the string selection line SSL, and the ground selection line GSL. Drains of the HV switches 100 may be respectively connected to a string selection (SS) signal line, signal lines S<0> to S<31>, and a ground selection (GS) signal line to which voltages are selectively applied according to an operation mode. Gates of the HV switches 100 may be connected to a block selection line BLKSEL.

When the corresponding block is selected through the block selection line BLKSEL, a word line driver 110 of FIG. 2 may transmit appropriate voltage signals SS, S<0> to S<31>, and GS to the word lines WL<0> to WL<31>, the string selection line SSL, and the ground selection line GSL according to an operation mode. The appropriate voltage signals SS, S<0> to S<31>, and GS may be transmitted to the cell string through the HV switches 100 of FIG. 1. Thus, the HV switches 100 of the selected block may be turned on and transmit required voltages to the word lines WL<0> to WL<31>. Conversely, when the block is not selected, the HV switches 100 may be turned off, e.g., the block selection line BLKSEL may be maintained at a voltage of about 0V.

Referring to FIG. 2, a program voltage Vpgm, a pass voltage Vpass, an erase voltage Vera, and a verification voltage Vver may be transmitted to the word line driver 110.

The word line driver 110 may transmit required voltage signals to the string selection line SSL, the ground selection line GSL, and the word lines WL<0> to WL<31>. For example, one of the program voltage Vpgm, the pass voltage Vpass, the erase voltage Vera, and the verification voltage Vver may be selectively transmitted to each of the word lines WL<0> to WL<31> according to an operation mode.

An X-decoder 120 may select blocks or rows in response to a row address signal X-ADD. The word line voltage signals S<0> to S<31> output by the word line driver 110 may be transmitted to word lines WL<0> to WL<31> of selected rows. The above-described operation may be enabled by turning on the HV switches 100 corresponding to the row address signal X-ADD.

A negative voltage generator 130 may generate a negative high voltage and transmit the negative high voltage as an erase verification voltage Vver or a bulk voltage Vneg of the HV switches 100.

A bulk voltage switch 140 may selectively transmit the bulk voltage Vneg of the HV switches 100 of the X-decoder 120. That is, during the erase verification operation, the bulk voltage switch 140 may transmit the bulk voltage Vneg, which is the negative high voltage, to the X-decoder 120. In other operation modes, the bulk voltage switch 140 may transmit the ground voltage Vgnd as the bulk voltage Vneg of the HV switches 100.

A bulk voltage control logic 150 may control a selection operation of the bulk voltage switch 140 in response to an operation mode. During the erase verification operation, the bulk voltage control logic 150 may control the bulk voltage switch 140 such that a negative high voltage is transmitted as the bulk voltage Vneg of the HV switches 100. In the other operation modes, the bulk voltage control logic 150 may control the bulk voltage switch 140 such that a ground voltage Vgnd is transmitted as the bulk voltage Vneg of the HV switches 100.

A cell array region 160 may include the NAND flash memory cells MC0 to MC31 connected to the bit line BL and the word lines WL<0> TO WL<31>. The NAND flash memory cells MC0 to MC31, which constitute a plurality of strings, may be connected in series to one bit line BL. The memory cells MC0 to MC31, which constitute the plurality of strings, may constitute a memory block, which is the unit of erase operation.

A page buffer 170 may function as a write driver or a sense amplifier depending on an operation mode. For example, the page buffer 170 may function as the write driver in a program operation mode and function as a sense amplifier in a read operation mode. Also, during an erase verification operation, a turn-on state of each of the cell strings may be sensed using an erase verification voltage Vver. The erase verification operation may be performed using sensed data.

Hereafter, an erase operation (in which a negative high voltage is applied to the word lines WL<0> to WL<31>) and the erase verification operation (in which the bulk voltage Vneg is applied to a bulk region to confirm whether or not data has been erased) will be described.

Referring to FIGS. 1 and 2, an erase voltage of about 20V may be applied to the bulk region of the cell array region 160. Thereafter, in order to confirm whether data has been erased, the word line driver 110 may be driven to transmit the erase verification voltage Vver to the word lines WL<0> to WL<31>. The erase verification voltage Vver may be generated by the negative voltage generator 130 and transmitted as a negative high voltage. A negative voltage lower than 0V may be used as the erase verification voltage Vver in order to obtain a denser distribution chart. In this regard, a negative voltage applied to the word lines WL<0> to WL<31> increases the density of distribution of a threshold voltage corresponding to an erase state.

Bulk voltages Vneg of the HV switches 100, biased to voltages below the above-described erase verification voltage Vver, may be used to transmit the erase verification voltage Vver to the word lines WL<0> to WL<31> through the HV switches 100. During the erase verification operation, a voltage having the same voltage level as, or a lower voltage level than, the erase verification voltage Vver may be applied to the bulk regions of the HV switches 100 included in the X-decoder 120. Thus, voltages generated by the negative voltage generator 130 may be selectively transmitted to the bulk regions of the HV switches 100 by the bulk voltage switch 140. As a result, the erase verification voltage Vver may be transmitted from the word line driver 110 to the word lines WL<0> to WL<31> without loss.

Further to the above, when the high-voltage is transmitted from the HV switches 100 to the bulk regions during the erase verification operation, voltage and signal losses may occur. Also, the bulk voltage switch 140 may be connected to the bulk regions in order to apply a negative voltage to the bulk regions. Since the HV switches 100 or the bulk voltage switch 140 apply the high voltage, peripheral circuit devices may be damaged, and the HV switches 100 and the bulk voltage switch 140 may be affected by each other. Accordingly, an insulation characteristic between the HV switches 100 and the bulk voltage switch 140 may be enhanced, as explained further below.

FIG. 3 illustrates a longitudinal sectional view of well structures of a cell array region and a peripheral region of a NAND flash memory device according to example embodiments.

The cell array region 160 may be a region where NAND flash memory cells MC0 to MC31 are disposed. Each of the memory cells MC0 to MC31 may have a transistor structure in which a floating gate 222 and a control gate 226 are stacked. The floating gate 222 may be formed over a semiconductor substrate 210 with a tunnel oxide layer 220 interposed therebetween, and the control gate 226 may be formed over the floating gate 222 with an interlayer dielectric layer 224 interposed therebetween. A ground selection transistor GST and a string selection transistor SST do not require the floating gate 222 that is configured to store data. Thus, the floating gate 222 may be electrically connected to the control gate 226. A source region S and a drain region D, between which the tunnel oxide layer 220 is interposed, may be formed with n-type impurities.

The well structure of the cell array region 160 may include a p-substrate 210, a first well 310, and a first pocket well 312. The first well 310 may be of an n type. The first pocket well 312 may be of a p type, and may be surrounded by the first well 310 and function as bulk regions of the memory cells MC0 to MC31.

Aspects of the cell array region 160 having a triple well structure as described above will now be described. When an erase voltage of about 20V is applied to the first pocket well 312, since the first well 310 may surround the first pocket well 312 and a P-N junction is formed between the first well 310 and the substrate 210, application of the high voltage of about 20V to the peripheral region 190 may be prevented. Thus, the peripheral region 190 may not be affected by the high voltage because of the triple well structure of the cell array region 160, and voltage and signal losses may be prevented.

The peripheral region 190 may be electrically isolated from the cell array region 160. An isolation layer may be formed between the peripheral region 190 and the cell array region 160. A transistor for an LV switch and transistors for HV switches, each of which is selected from an NMOS transistor and a PMOS transistor, may be disposed in the peripheral region 190. The peripheral region 190 may include an LV NMOS region where an NMOS transistor for an LV switch is disposed, an LV PMOS region where a PMOS transistor for an LV switch is disposed, an HV NMOS region where an NMOS transistor for an HV switch is disposed, and an HV PMOS region where a PMOS transistor for an HV switch is disposed.

A second well 320 may be provided in the LV NMOS region, a third well 330 may be provided in the LV PMOS region, a fourth well 340 may be provided in the HV NMOS region, and a fifth well 350 may be provided in the HV PMOS region.

In order to apply the erase verification voltage Vver to the word lines WL <0> to WL<31 during the erase verification operation, the well structure of the peripheral region 190 may include a second well 320 configured to accommodate the NMOS transistor of the transistors for the LV switches, a third well 330 configured to accommodate the PMOS transistor of the transistors for the LV switches, a fourth well 340 configured to accommodate the NMOS transistor of the transistors for the HV switches, and a fifth well 350 configured to accommodate the PMOS transistor of the transistors for the HV switches.

The second well 320 may be doped with p-type impurities, the third well 330 may be doped with n-type impurities, and the fifth well 350 may be doped with n-type impurities like the third well 330. The fourth well 340 may directly use the substrate 210 as a bulk region. The substrate 210 may be a p-substrate.

The first and third wells 310 and 330 may be doped with the n-type impurities of a different conductivity type from the substrate 210, and the PMOS transistors may be formed in the first and third n-wells 310 and 330 to improve PMOS characteristics and isolation characteristics.

The second well 320 may be doped with p-type impurities of the same conductivity type as the substrate 210, so the NMOS transistor accommodated in the second well 320 may not have tolerance to a high voltage. Also, by forming the NMOS transistor in the second p-well 320, punch-through characteristics of a short channel may be improved.

Also, the fourth well 340 may not specially form the well structure, but may instead maintain the same bulk concentration as the substrate 210. This may provide the NMOS transistor accommodated in the fourth well 240 with good tolerance to a high voltage and a body effect may be increased due to a low bulk concentration of the substrate 210.

FIG. 4 illustrates a longitudinal sectional view of a flash memory device according to other example embodiments.

Referring to FIG. 4, a pocket p-well 344 configured to accommodate an NMOS transistor and an n-well 346 configured to surround the pocket p-well 344 may be provided in an HV NMOS region where the NMOS transistor for an HV switch is disposed. Thus, a triple well structure may be formed.

Referring back to FIG. 3, in order to apply a bulk voltage, an NMOS transistor for an LV bulk voltage switch and an NMOS transistor for an HV bulk voltage switch may be disposed in the peripheral region 190.

The peripheral region 190 may further include an LV NMOS region where the NMOS transistor for the LV bulk voltage switch is disposed to apply the bulk voltage and an HV NMOS region where the NMOS transistor for the HV bulk voltage switch is disposed to apply the bulk voltage. In FIG. 3, a region including the HV switches 100 is illustrated as a first peripheral region, while a region including the bulk voltage switch 140 is illustrated as a second peripheral region.

A sixth well 360 may be provided in the LV NMOS region, and a seventh well 370 may be provided in the HV NMOS region.

Accordingly, in order to enable application of the bulk voltage to the bulk region of the HV switch during the erase verification operation, the well structure of the peripheral region 190 may further include the sixth well 360 and a second pocket well 362. The sixth well 360 may be of an n type, which is a second conductivity type different from the substrate 210. The second pocket well 362, which is of a p type, may function as a bulk region of the NMOS transistor out of transistors for the LV switches and may be surrounded by the sixth well 360. Also, the well structure of the peripheral region 190 may further include the seventh well 370 and a third pocket well 372. The seventh well 370 may be of a p type. The third pocket well 372, which is of a p type, may function as the bulk region of the NMOS transistor of transistors for the HV switches and surrounded by the seventh well 370.

As described above, the bulk voltage switch 140 may have a triple well structure in order to enhance an insulation characteristic between the NMOS transistor or the PMOS transistor for the LV or HV switch and the NMOS transistor for the bulk voltage switch 140.

As described above, the cell region 160 also may have a triple well structure so that damage to circuits of the peripheral region 190 can be prevented when a high voltage of about 20V is applied to the cell array region 160 during erase operation. However, this phenomenon may occur not only between the cell array region 160 and the peripheral region 190 but also in the peripheral region 190. For example, even when the bulk voltage switch 140 applies the bulk voltage to the peripheral region 190, the LV or HV NMOS transistor may apply electric shock to other switches of the peripheral region 190.

Figure 5:
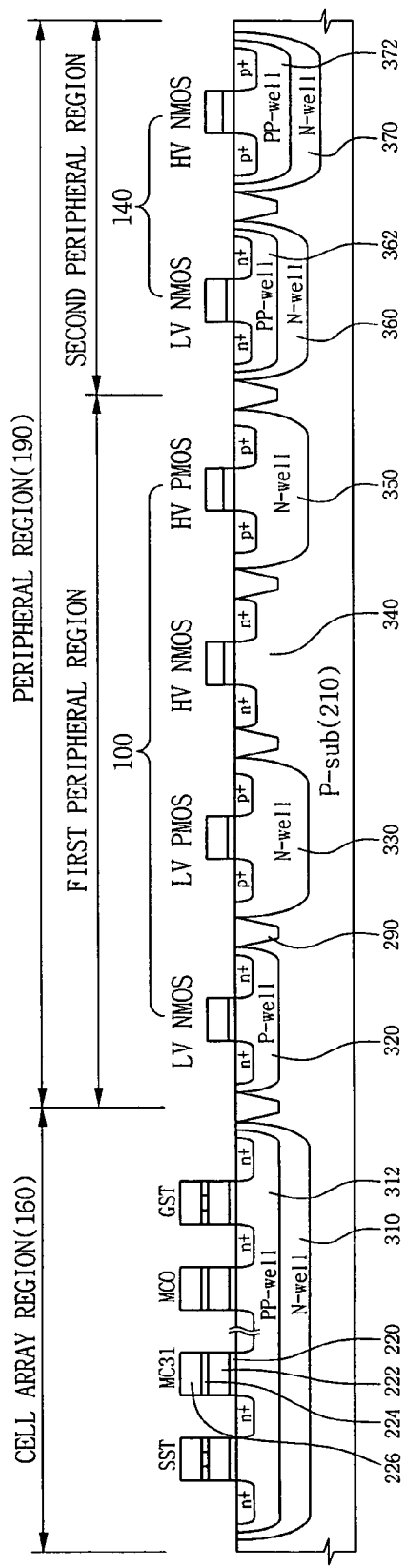
FIG. 5 illustrates a longitudinal sectional view of a well structure in which a second pocket well and a seventh well of a peripheral region are formed to greater depths than a first pocket well and a first well of a cell array region, according to example embodiments.

FIG. 5 illustrates a longitudinal sectional view of a well structure in which a second pocket well and a seventh well of a peripheral region are formed to greater depths than a first pocket well and a first well of a cell array region, according to example embodiments.

Referring to FIG. 5, in order to minimize voltage loss and improve an insulation characteristic, a triple well may be doped with impurities as follows. The third pocket well 372 may be doped with p-type impurities, such as boron (B) ions, so that the third pocket well 372 can be formed as a p type. During an ion implantation process of p-type impurities, a projected range Rp may be greater than 1.0 µm. The projected range Rp of the third pocket well 372 may be about 1.5 to 2.0 times the projected range Rp of the first pocket well 312 of the cell array region 160. Also, the doping concentration of the p-type impurities may be lower than in the cell region 160. Thus, the doping concentration of the third pocket well 372 may range from $1E^{11}$ atoms/cm$^2$ to $1E^{13}$ atoms/cm$^2$.

The seventh well 370 may be doped with n-type impurities, such as phosphorus (P) ions, so that the seventh well 370 can be formed as an n type. During an ion implantation process of n-type impurities, a deep n-well (DNW) may be formed, unlike in the cell array region 160. The projected range Rp of the DNW may be greater than about 1.5 µm. Also, the doping concentration of n-type impurities may be lower than in the cell array region 160. Thus, the doping concentration of the seventh well 270 may range from about $1E^{11}$ atoms/cm$^2$ to about $2E^{13}$ atoms/cm$^2$.

Thus, the first pocket well 312 of the cell array region 160 may be doped with impurities to a depth D3 (see FIG. 7D) into the substrate 210, and the first well 310 of the cell array region 160 may be doped with impurities to a depth D1 (see FIG.

Figure 7A:
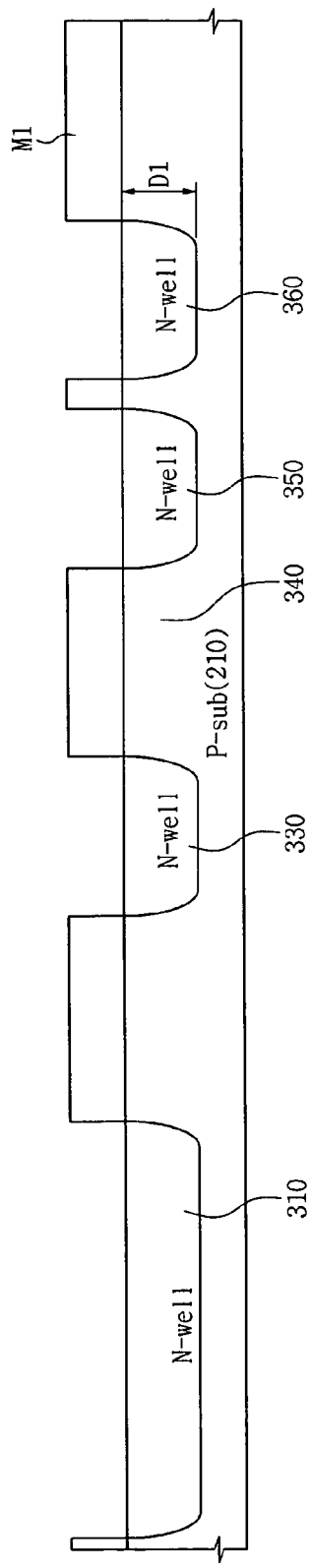
FIGS. 7A through 7E illustrate longitudinal sectional views of aspects of a method of forming the well structure of FIG. 5, according to example embodiments.
Figure 7B:
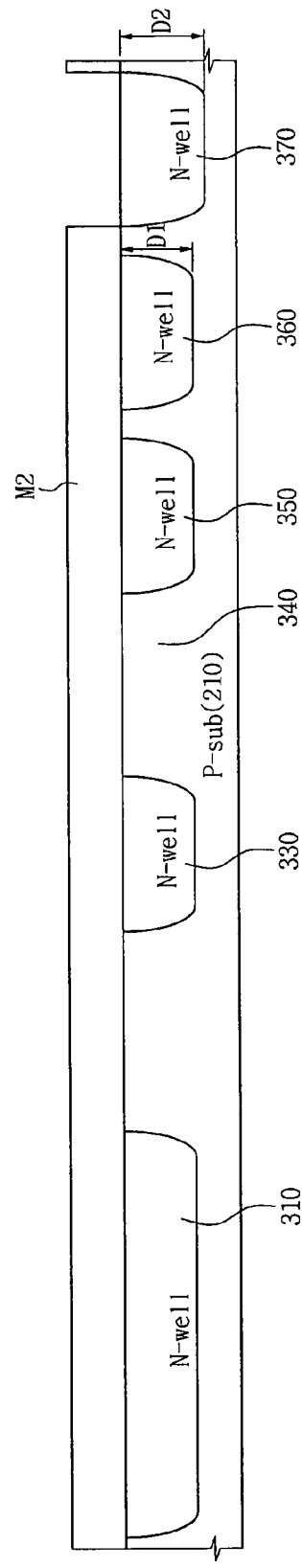

7A), while the third pocket well 372 of a peripheral region 190 may be doped with impurities to a depth D4 (see FIG. 7E) and the seventh well 370 of the peripheral region 190 may be doped with impurities to a depth D2 (see FIG. 7B). Thus, the seventh well 370 may have a DNW structure. Also, the doping concentrations of wells may be gradually reduced in a depthwise direction of the substrate 210. Accordingly, a high breakdown voltage may be maintained between the third pocket well 372 and the substrate 210. Thus, even if a high voltage is applied to the seventh well 370, voltage and signal losses may not occur.

Figure 6:
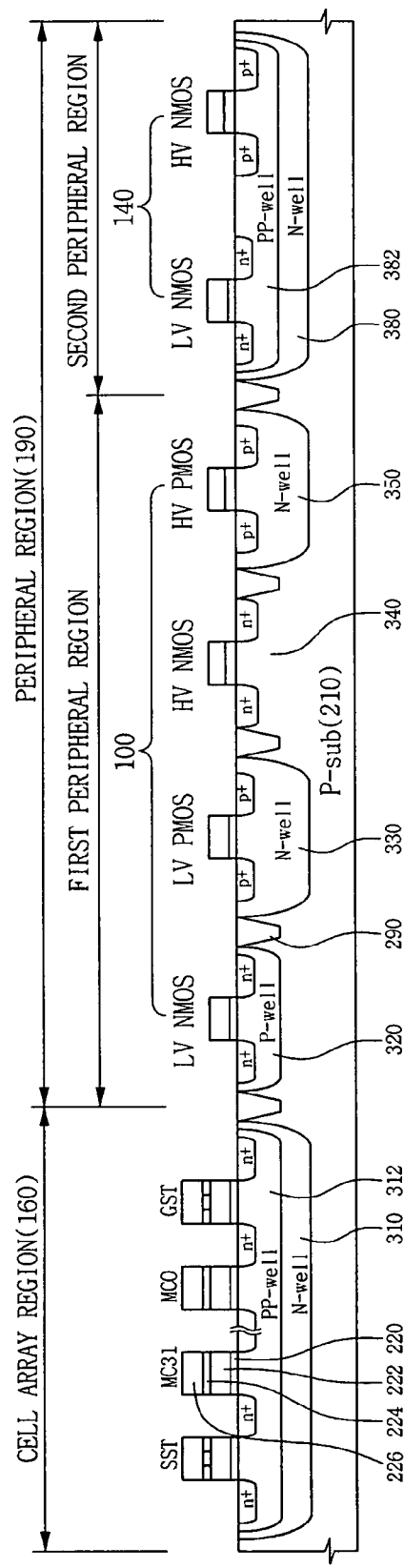
FIG. 6 illustrates a longitudinal sectional view of a well structure of a flash memory device using a common bulk region according to still other example embodiments.

FIG. 6 illustrates a longitudinal sectional view of a well structure of a flash memory device using a common bulk region according to other example embodiments.

Referring to FIG. 6, an LV PMOS region (where an NMOS transistor for an LV bulk voltage switch is disposed) and an HV PMOS region (where an NMOS transistor for an HV bulk voltage switch is disposed) may have a common bulk region. For example, the LV NMOS transistor and the HV NMOS transistor may be supported by a common fourth pocket well 382, and the fourth pocket well 382 may be surrounded by an eighth well 380.

Hereinafter, methods of fabricating wells of a flash memory device according to example embodiments will be described.

FIGS. 7A through 7E illustrate longitudinal sectional views of aspects of a method of forming the well structure of FIG. 5, according to example embodiments.

Referring to FIG. 7A, a pad oxide layer (not shown) and a nitride layer (not shown) may be stacked on a top surface of a p-type semiconductor substrate 210 of a first conductivity type using an ordinary method. An etching process may be performed until only a portion where p-wells will be formed is left, thereby forming a first ion implantation mask M1 over the portion where p-wells will be formed. During the etching process, a cell array region 160 where a first well 310 will be formed, an LV PMOS region of a first peripheral region where a third well 330 will be formed, and an HV PMOS region of the first peripheral region where a fifth well 350 will be formed may be exposed, but an HV NMOS region of a second peripheral region where a seventh well 370 will be formed may not be exposed. The first ion implantation mask M1 may be, e.g., a photoresist pattern formed by exposing and developing photoresist (PR).

In order to form an n-well of a second conductivity type in a portion exposed by the first ion implantation mask M1, n-type impurities, such as phosphorous ions, may be implanted into the exposed portion. In this case, the n-type impurities may be implanted to a depth D1. Thus, the first n-well 310 may be formed in the cell array region 160, and the third n-well 330 and fifth n-well 350 may be formed in the first peripheral region 190. The first ion implantation mask M1 may be removed using an ordinary method.

Referring to FIG. 7B, a second ion implantation mask M2 may be formed to expose an HV NMOS region of the second peripheral region where a seventh well 370 will be formed. In this case, n-type impurities may be implanted to a depth D2 greater than the depth D1. The doping concentration of the n-type impurities may be reduced according to the depth D2. Thus, the seventh n-well 370 having a great depth may be formed. The second ion implantation mask M2 may be removed using an ordinary method.

Figure 7C:
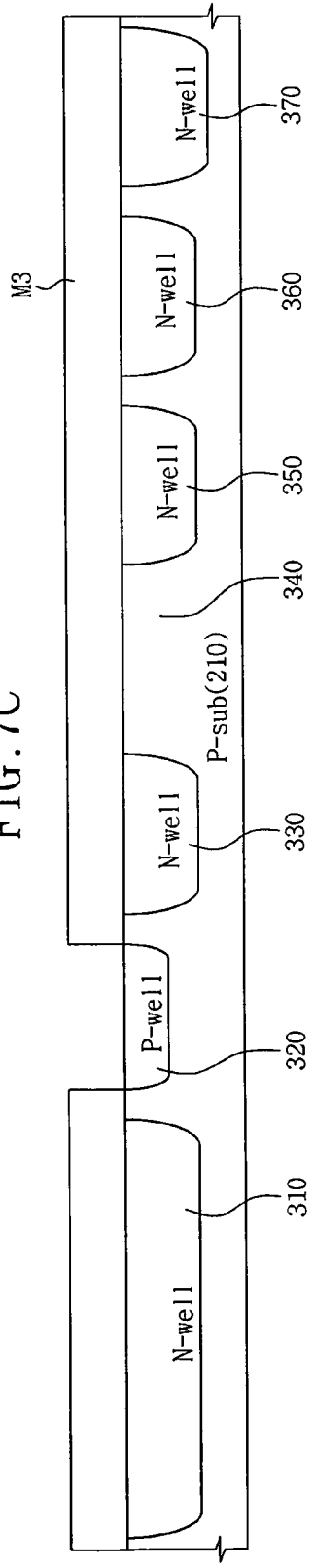

Referring to FIG. 7C, a third ion implantation mask M3 may be formed to expose a portion corresponding to an LV NMOS region of the first peripheral region, where a second well 320 will be formed. In order to form a p-well in the portion exposed by the third ion implantation mask M3, p-type impurities, such as boron ions, may be implanted into the exposed portion. Thus a second p-well 320 may be formed. The third ion implantation mask M3 may be removed using an ordinary method.

Figure 7D:
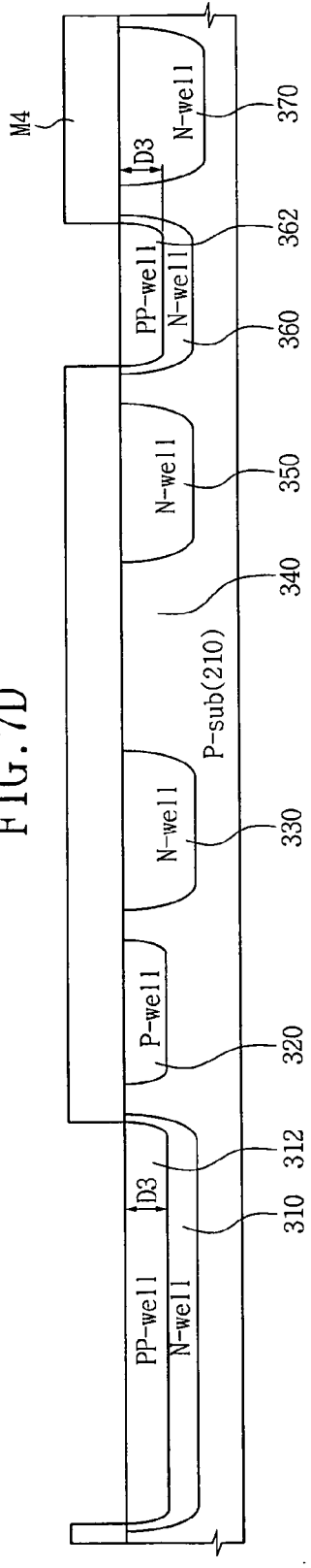

Referring to FIG. 7D, a fourth ion implantation mask M4 may be formed to expose a portion corresponding to a cell array region, where a first pocket well 312 will be formed, and an LV NMOS region of the second peripheral region, where a second pocket well 362 will be formed. In order to form pocket p-wells in the portion exposed by the fourth ion implantation mask M4, p-type impurities, such as boron ions, may be implanted into the exposed portion. In this case, the p-type impurities may be implanted to a depth D3. Thus, formation of triple wells including the pocket p-wells and the n-wells may be completed. The fourth ion implantation mask M4 may be removed using an ordinary method.

Figure 7E:
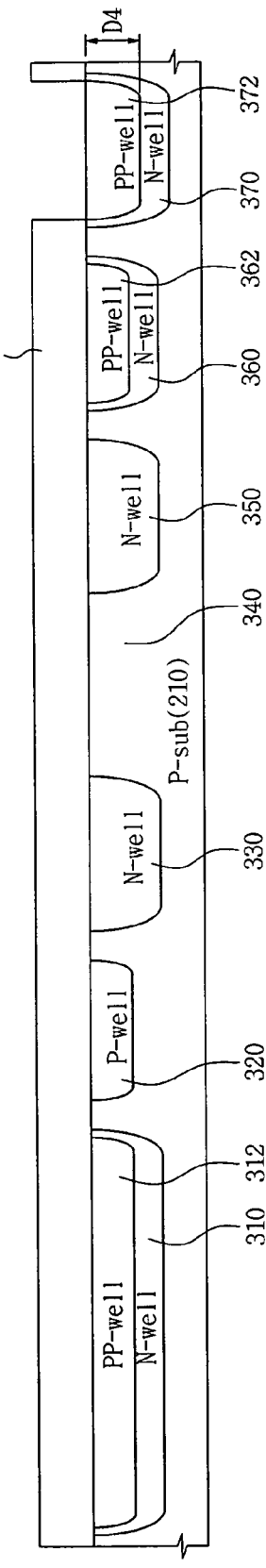

Referring to FIG. 7E, a fifth ion implantation mask M5 may be formed to expose an NV NMOS region of the second peripheral region, where a third pocket well will be formed. In order to form the pocket p-well in a portion exposed by the fifth ion implantation mask M5, p-type impurities, such as boron ions, may be implanted into the exposed portion. In this case, the p-type impurities may be implanted to a depth D4. Thus, formation of a triple well including the pocket p-wells and the DNW may be completed. The fifth ion implantation mask M5 may be removed using an ordinary method.

A process of forming an isolation layer 290 to separate the respective wells and a process of forming a transistor on a top surface of the substrate 210 may be performed using ordinary semiconductor fabrication methods, and thus descriptions thereof will be omitted.

As described above, example embodiments may provide a triple well structure in which a cell array region and a peripheral region are electrically isolated from each other. Also, example embodiments may provide a triple well structure in which respective switches of a peripheral region are electrically isolated from one another. Furthermore, example embodiments may provide a triple well structure of a flash memory device.

According to the example embodiments as described above, a flash memory device according to example embodiments may have at least one of the following effects.

First, a cell array region may be electrically isolated from a peripheral region, and switches of the peripheral region may be electrically isolated from one another so that voltage and signal losses may be minimized throughout the entire bulk region.

Second, a bulk voltage switch may have a triple well structure, thereby enhancing an insulation characteristic between the bulk voltage switch and an LV or HV switch.

Third, in an HV PMOS region for the bulk voltage switch, the projected range Rp of a pocket p-well configured to accommodate a PMOS transistor and the projected range Rp of an n-well configured to surround the pocket p-well may increase, so that the doping concentrations of the pocket p-well and the n-well may be reduced, a breakdown voltage between the pocket p-well and a substrate may be increased, and operation effects may be improved in a depthwise direction.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A flash memory device, comprising:
a cell array region where a plurality of memory cells are connected in series to a single cell string, the cell array region including a pocket p-well configured to accommodate the plurality of memory cells and an n-well configured to surround the pocket p-well;
a first peripheral region where low-voltage (LV) and high-voltage (HV) switches are connected to the memory cells through a word line, the first peripheral region including:
an LV NMOS region where an NMOS transistor for the LV switch is disposed,
an LV PMOS region where a PMOS transistor for the LV switch is disposed,
an HV NMOS region where an NMOS transistor for the HV switch is disposed, and
an HV PMOS region where a PMOS transistor for the HV switch is disposed; and
a second peripheral region where bulk voltage switches are connected to bulk regions of the LV and HV switches, the second peripheral region including an HV PMOS region where an NMOS transistor for an HV bulk voltage switch is disposed, the HV PMOS region including a pocket p-well configured to accommodate the NMOS transistor for the HV bulk voltage switch and an n-well configured to surround the pocket p-well.

2. The device as claimed in claim 1, wherein in the first peripheral region:
a p-well of the same conductivity type as a substrate is provided in the LV NMOS region where the NMOS transistor for the LV switch is disposed, and
an n-well of a different conductivity type from the substrate is provided in both the LV PMOS region where the PMOS transistor for the LV switch is disposed and the HV PMOS region where the PMOS transistor for the HV switch is disposed.

3. The device as claimed in claim 2, wherein in the first peripheral region, the HV NMOS region where the NMOS transistor for the HV switch is disposed maintains the same bulk concentration as the substrate.

4. The device as claimed in claim 2, wherein, in the first peripheral region, a pocket p-well configured to accommodate the NMOS transistor for the HV switch and an n-well configured to surround the pocket p-well are provided in the HV NMOS region where the NMOS transistor for the HV switch is disposed.

5. The device as claimed in claim 1, wherein:
the second peripheral region further comprises an LV PMOS region where an NMOS transistor for an LV bulk voltage switch is disposed,
a pocket p-well configured to accommodate the NMOS transistor for the LV bulk voltage switch and an n-well configured to surround the pocket p-well are provided in the LV PMOS region where the NMOS transistor for the LV bulk voltage switch is disposed, and
in the second peripheral region, the n-well and the pocket p-well of the HV PMOS region are doped with impurities to greater depths and at lower doping concentrations than the n-well and the pocket p-well of the LV PMOS region.

6. The device as claimed in claim 1, wherein:
the second peripheral region further comprises an LV PMOS region where an NMOS transistor for an LV bulk voltage switch is disposed, and
in the second peripheral region, the LV PMOS region where the NMOS transistor for the LV bulk voltage switch is disposed and the HV PMOS region have a common bulk region.

7. A flash memory device, comprising:
cell transistors disposed in a cell array region and configured to have a cell array structure;
a low-voltage (LV) switch and a high-voltage (HV) switch disposed in a peripheral region to transmit a negative voltage to word lines of the cell transistors; and
a bulk voltage switch disposed in the peripheral region and configured to transmit the negative voltage as bulk voltages of the LV and HV switches, wherein:
each of the cell transistors has a first triple well structure to be electrically isolated from the peripheral region, and
the bulk voltage switch has a second triple well structure to be electrically isolated from the LV and HV switches.

8. The device as claimed in claim 7, wherein:
the first triple well structure comprises:
a first n-well of a different conductivity type from a p-substrate; and
a first pocket p-well of the same conductivity type as the p-substrate surrounded by the first n-well to function as bulk regions of the cell transistors,
the second triple well structure comprises:
a second n-well of a different conductivity type from the p-substrate; and
a second pocket p-well of the same conductivity type as the p-substrate surrounded by the second n-well to function as bulk regions of the cell transistors, and
the first and second n-wells or the first and second pocket p-wells have the same projected range and doping concentration.

9. The device as claimed in claim 8, wherein:
each of the LV and HV switches includes a transistor configured to apply a negative voltage and a well functioning as a bulk region of the transistor of each of the LV and HV switches,
the transistor of each of the LV and HV switches is selected from an NMOS transistor for the LV switch, a PMOS transistor for the LV switch, an NMOS transistor for the HV switch, and a PMOS transistor for the HV switch, and
the well of each of the LV and HV switches is selected from a p-well doped with impurities of the same conductivity type as the p-substrate, an n-well doped with impurities of a different conductivity type from the p-substrate, and a p-well having the same bulk concentration as the p-substrate.

10. The device as claimed in claim 9, wherein the bulk voltage switch includes an HV NMOS transistor accommodated in the second pocket p-well.

11. The device as claimed in claim 10, wherein the second pocket p-well has a projected range of about 1.0 μm or more, the projected range of the second pocket p-well being greater than the projected range of the first pocket p-well.

12. The device as claimed in claim 10, wherein the second n-well has a projected range of about 1.5 μm or more, the projected range of the second n-well being greater than the projected range of the first n-well.

13. The device as claimed in claim 10, wherein the second pocket p-well has a doping concentration ranging from about $1E^{11}$ atoms/cm$^2$ to about $1E^{13}$ atoms/cm$^2$, the doping concentration of the second pocket p-well being lower than the doping concentration of the first pocket p-well.

14. The device as claimed in claim 10, wherein the second n-well has a doping concentration ranging from about $1E^{11}$ atoms/cm² to about $2E^{13}$ atoms/cm², the doping concentration of the second n-well being lower than the doping concentration of the first n-well.

15. A well structure of a flash memory device having a cell array region, where cell transistors are disposed, and a peripheral region configured to operate the cell array region, the well structure of the flash memory device comprising:
 a well structure of the cell array region; and
 a well structure of the peripheral region, wherein:
 the well structure of the cell array region includes:
  a substrate of a first conductivity type;
  a first well of a second conductivity type different from the substrate; and
  a first pocket well of the first conductivity type surrounded by the first well to function as bulk regions of the cell transistors, and
 the well structure of the peripheral region includes:
  a second well of the first conductivity type configured to accommodate NMOS transistors for LV switches;
  a third well of the second conductivity type configured to accommodate PMOS transistors for the LV switches;
  a fourth well configured to accommodate NMOS transistors for HV switches to use the substrate as a bulk region;
  a fifth well of the second conductivity type configured to accommodate PMOS transistors for the HV switches;
  a sixth well of the second conductivity type configured to accommodate the NMOS transistors for the LV switches;
  a second pocket well of the first conductivity type surrounded by the sixth well to function as bulk regions of transistors for bulk voltage switches;
  a seventh well of the second conductivity type configured to accommodate the NMOS transistors for the HV switches; and
  a third pocket well of the first conductivity type surrounded by the seventh well to function as bulk regions of the transistors for the bulk voltage switches.

16. The well structure as claimed in claim 15, wherein the projected range of the third pocket well is about 1.5 times the projected range of the first pocket well or the second pocket well.

17. The well structure as claimed in claim 15, wherein the third pocket well has a projected range of more than about 1.0 μm.

18. The well structure as claimed in claim 15, wherein the third pocket well has a lower doping concentration than the first pocket well or the second pocket well.

19. The well structure as claimed in claim 15, wherein the doping concentration of the third pocket well ranges from about $1E^{11}$ atoms/cm² to about $1E^{13}$ atoms/cm².

20. The well structure as claimed in claim 15, wherein the seventh well has a projected range of about 1.5 μm or more, the projected range of the seventh well being greater than the projected range of the first well or the sixth well.

* * * * *